United States Patent
Jin et al.

(10) Patent No.: US 10,950,679 B1
(45) Date of Patent: Mar. 16, 2021

(54) DISPLAY HAVING VERTICALLY DRIVEN GATE AND DATA PATHS

(71) Applicant: Apple Inc., Cupertino, CA (US)

(72) Inventors: Jiayi Jin, Saratoga, CA (US);
Chin-Wei Lin, San Jose, CA (US);
Shyuan Yang, Burlingame, CA (US);
Weijun Yao, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/108,686

(22) Filed: Aug. 22, 2018

Related U.S. Application Data

(60) Provisional application No. 62/555,489, filed on Sep. 7, 2017.

(51) Int. Cl.
| | |
|---|---|
| *H01L 27/32* | (2006.01) |
| *G09G 3/3275* | (2016.01) |
| *G09G 3/3225* | (2016.01) |
| *H01L 27/12* | (2006.01) |

(52) U.S. Cl.
CPC ....... *H01L 27/3276* (2013.01); *G09G 3/3225* (2013.01); *G09G 3/3275* (2013.01); *H01L 27/124* (2013.01); *H01L 27/3218* (2013.01); *H01L 27/323* (2013.01)

(58) Field of Classification Search
CPC ..... G02F 1/136286; G02F 2001/13456; G02F 1/13454; G09G 2300/0426; G09G 2310/0281; G09G 3/3648; G09G 2310/0278
See application file for complete search history.

(56) References Cited

U.S. PATENT DOCUMENTS

| | | | |
|---|---|---|---|
| 8,378,952 B2 | 2/2013 | Kim | |
| 8,400,475 B2 | 3/2013 | Park et al. | |
| 2006/0033871 A1* | 2/2006 | Kim | G02F 1/134309 349/139 |
| 2008/0036797 A1* | 2/2008 | Whang | G09G 3/006 345/698 |
| 2010/0295764 A1* | 11/2010 | Wang | G02F 1/136286 345/92 |
| 2013/0093657 A1* | 4/2013 | Song | G09G 3/3648 345/92 |
| 2014/0152938 A1* | 6/2014 | Lee | G09G 3/3648 349/46 |

(Continued)

*Primary Examiner* — Koosha Sharifi-Tafreshi
(74) *Attorney, Agent, or Firm* — Treyz Law Group, P.C.; G Victor Treyz; Tianyi He

(57) ABSTRACT

A display may have an array of pixels arranged in rows and columns. The pixels may be organic light-emitting diode pixels that each include an organic light-emitting diode and thin-film transistor circuitry for controlling the diode or may be other suitable display pixels. The pixels may form an active area of the display that displays images. Display driver circuitry may be provided in an inactive border area of the display. The display may include vertical gate lines. The display may also include data lines. The data lines may include vertical data line portions and orthogonal horizontal data line portions coupled to the vertical data line portions with vias. During operation, data from the display driver circuitry may be provided to rows of the pixels using the data lines while the vertical gate lines supply control signals to columns of the pixels.

21 Claims, 6 Drawing Sheets

(56) References Cited

U.S. PATENT DOCUMENTS

| | | | |
|---|---|---|---|
| 2014/0168553 A1* | 6/2014 | Park | G02F 1/134363 349/43 |
| 2014/0375534 A1* | 12/2014 | Lee | G09G 3/3648 345/87 |
| 2015/0198854 A1 | 7/2015 | Song et al. | |
| 2016/0035294 A1 | 2/2016 | Kim et al. | |
| 2017/0294172 A1 | 10/2017 | Yang et al. | |

* cited by examiner

DISPLAY HAVING VERTICALLY DRIVEN GATE AND DATA PATHS

This application claims the benefit of provisional patent application No. 62/555,489, filed Sep. 7, 2017, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

Displays contain arrays of pixels for presenting images to users. Date lines that extend vertically through the display are associated with columns of the pixels. Control lines called gate lines that extend horizontally through the display are associated with rows of the pixels. The gate lines are used in controlling the loading of the data from the data lines into the pixels. Gate line driver circuitry along the left and right edges of the display is used in supplying gate line signals to the gate lines.

For aesthetic reasons and to save space in an electronic device, it may be desirable to reduce the size of the borders of a display and to create displays that are otherwise not constrained by the locations of display driver circuitry. The presence of driver circuitry along the edges of the display limits the minimum achievable border size for a display and restricts display layout. If care is not taken, a display will have larger inactive borders than desired.

SUMMARY

A display may have an array of pixels arranged in rows and columns. The pixels may be organic light-emitting diode pixels that each include an organic light-emitting diode and thin-film transistor circuitry for controlling the diode or may be other suitable display pixels. The pixels may form an active area of the display that displays images. Display driver circuitry may be provided in an inactive border area of the display.

Gate lines and data lines may be coupled to the pixels in the array of pixels. The gate lines may extend vertically through the array and may receive control signals from the display driver circuitry. Each column of pixels may be controlled by one or more corresponding vertical gate lines. While being controlled by the gate lines, data may be distributed from the display driver circuitry to rows of the pixels over data lines. The data lines may include vertical data line portions and horizontal data line portions coupled with vias. The vertical data line portions may be coupled to the display driver circuitry and may be used to distribute data to the horizontal data line portions.

DETAILED DESCRIPTION

Figure 1:
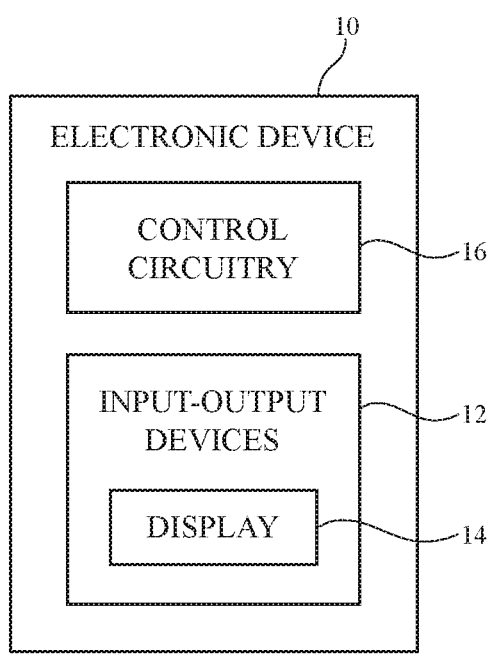
FIG. 1 is a schematic diagram of an illustrative electronic device with a display in accordance with an embodiment.

A schematic diagram of an illustrative electronic device of the type that may be provided with a display is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device, a pendant device, or other wearable or miniature device, a television, a computer display that does not contain an embedded computer, a gaming device, a navigation device, an embedded system such as a system in which electronic equipment with a display is mounted in a kiosk or automobile, a desktop computer, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be any suitable type of display. As an example, display 14 may be a liquid crystal display that includes an array of backlit liquid crystal display pixels, may be a light-emitting diode display that includes an array of light-emitting devices such as light-emitting diodes (e.g., organic light-emitting diodes, quantum dot light-emitting diodes, light-emitting diodes formed from discrete crystalline semiconductor dies, etc.), or may be any other type of display (e.g., an electrowetting display, an electrophoretic display, a plasma display, etc.). Illustrative configurations for display 14 in which display 14 includes an array of organic light-emitting diode pixels are sometimes described herein as an example.

Figure 2:
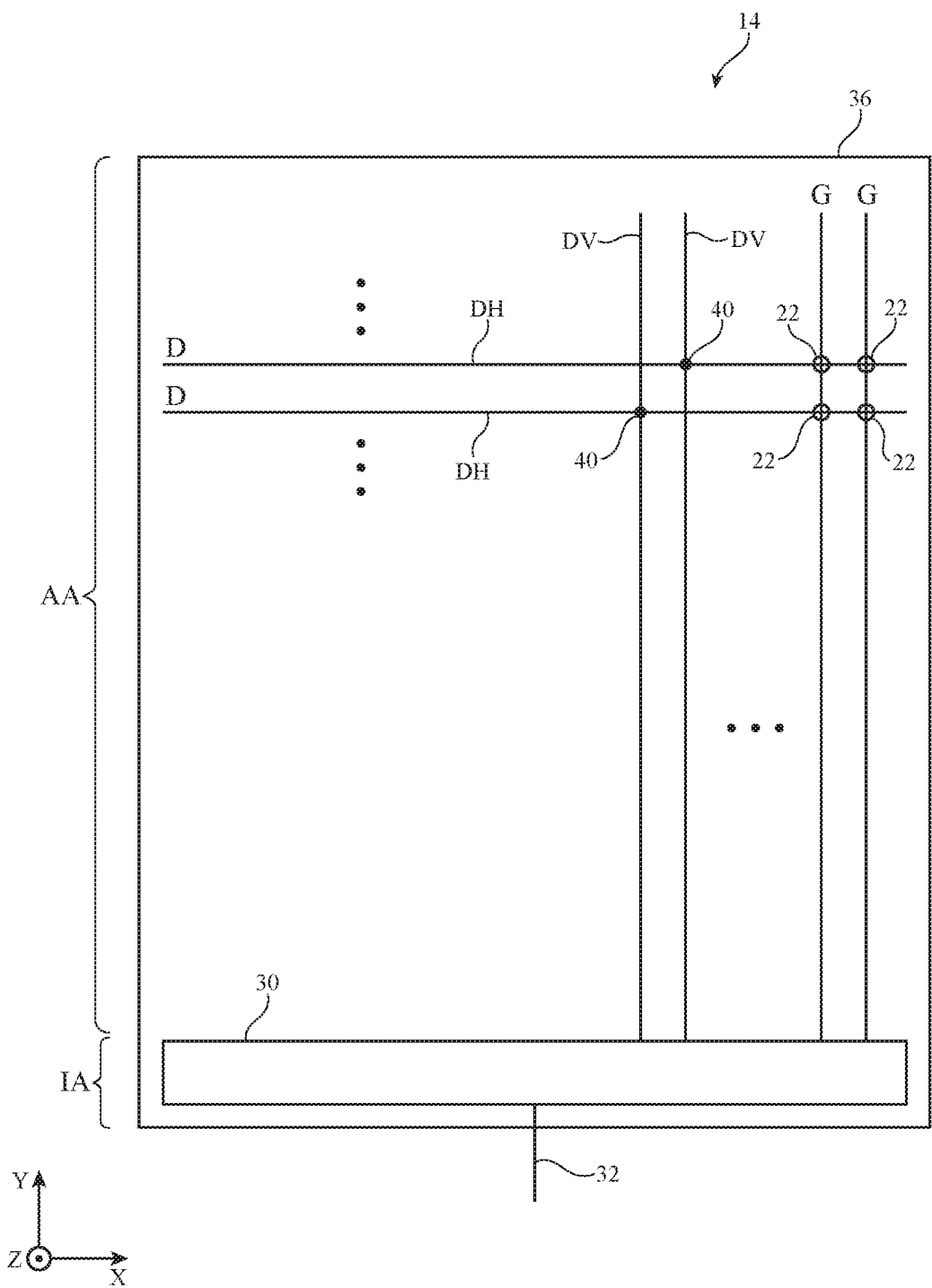
FIG. 2 is a diagram of an illustrative display in accordance with an embodiment.

FIG. 2 is a diagram of an illustrative display for device 10. As shown in FIG. 2, display 14 may have an array of pixels 22 for displaying images for a user. Pixels 22 may be formed from one or more display layers such as substrate layer 36. Substrate 36 may be rectangular and may have four edges, may be oval, may be circular, may have both straight and curved edges, or may have other suitable shapes. The array of pixels 22 may be arranged to form rows and columns. There may be any suitable number of rows and columns in the array of pixels 22 (e.g., ten or more, one hundred or more, or one thousand or more). In the illustrative configuration of FIG. 2, columns of pixels 22 extend vertically parallel to vertical dimension Y and rows of pixels extend horizontally parallel to horizontal dimension X.

Pixels 22 may each contain pixels (subpixels) of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry 30, which may be located along one of the edges of display 14, may be used to control the operation of pixels 22. Display driver circuitry 30 may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while providing control signals on control lines such as gate lines G.

Data lines D may have vertical portions DV (sometimes referred to as vertical data line extensions) and horizontal portions DH. Vertical portions DV and horizontal portions DH may be formed in different patterned metal layers in display 14 and may be connected using respective vias 40 (e.g., metal vias that extend between the metal layer containing vertical portions DV and the metal layer containing horizontal portions DH). Each horizontal portion DH may be associated with a respective row of pixels 22 (e.g., each data line portion DH may be coupled to all of the red subpixels in a row, all of the green subpixels in a row, or all of the blue subpixels in a row.

Gate lines G may extend vertically through display 36. The control signals on gate lines G may include scan line signals and emission enable control signals (e.g., in light-emitting diode displays), gate line signals for controlling pixels in liquid crystal displays, and/or other control signals (gate line signals) for controlling the pixels of each column. There may be any suitable number of gate lines G per column of pixels 22 (and subpixels) in display 14 (e.g., at least one, at least two, at least three, at least four, etc.). Configurations in which there are four gate lines G per column of pixels 22 may sometimes be described herein as an example. There may be more columns of pixels 22 than rows of pixels 22 in display 14 or there may be more rows of pixels 22 than columns of pixels 22 in display 14. Configurations in which the number of rows and columns of pixels 22 in display 14 are equal may also be used.

Display 14 may have an active area AA and an inactive area IA. Active area AA contains the array of pixels 22 that display images for a user of device 10. Inactive area IA forms an inactive border region running along the lower edge of display 14 and does not contain any pixels 22 for displaying images. Inactive area IA may contain circuitry such as display driver circuitry 30. It is not necessary to provide inactive border areas IA along the left edge or right edge of active area AA to accommodate gate driver circuitry, data line driver circuitry, or other display driver circuitry, because gate line signals may be routed from display driver circuitry 30 along the lower edge of display 14 to horizontal gate line portions GH using gate line portions GV. This helps minimize or eliminate undesired display border regions.

Figure 3:
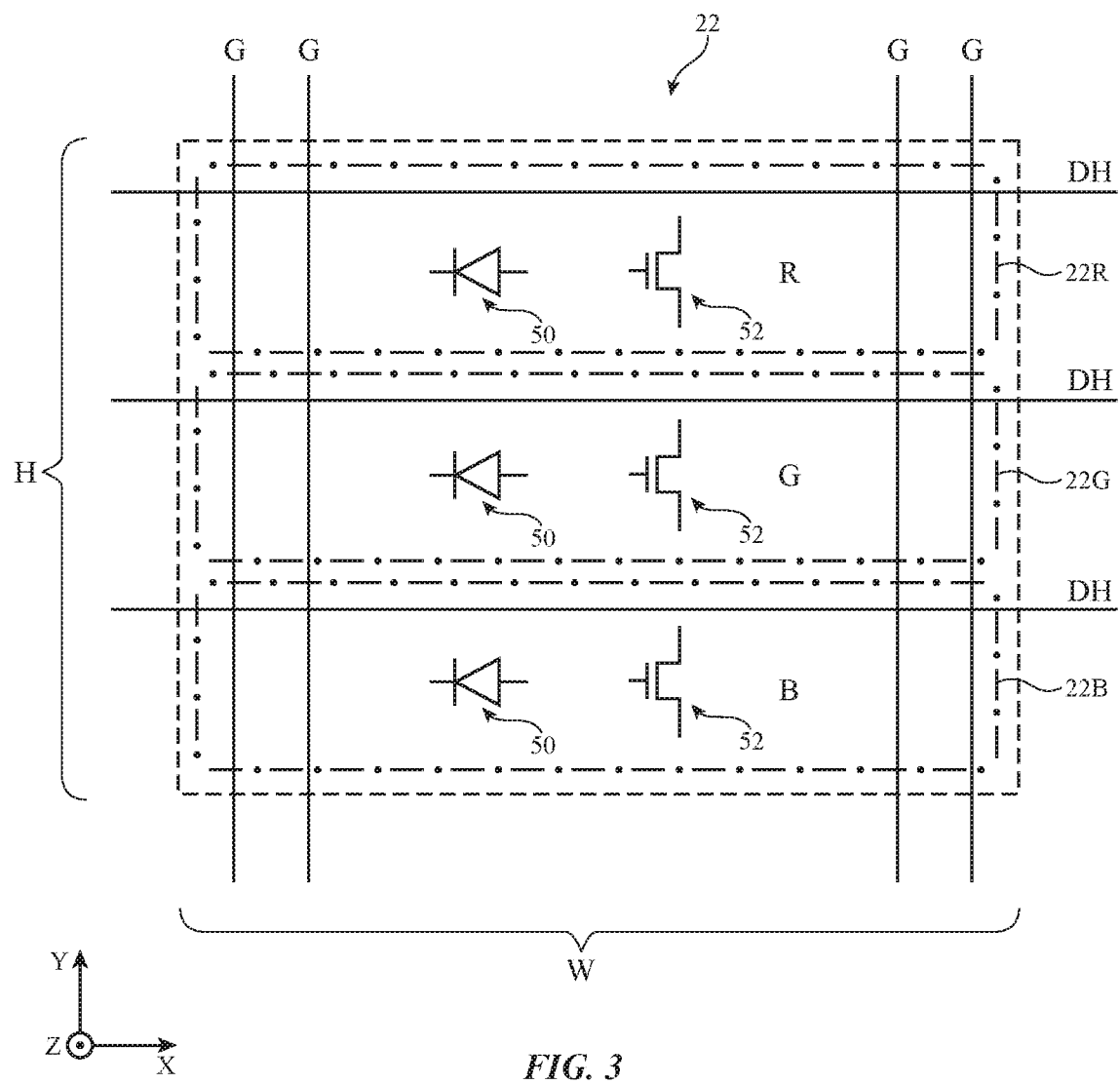
FIG. 3 is a diagram of an illustrative pixel in accordance with an embodiment.

As shown in FIG. 3, each pixel 22 may include three subpixels (sometimes referred to as pixels) such as red subpixels 22R, green subpixel 22G, and blue subpixel 22B. Each subpixel contains a respective light-emitting diode 50 (e.g., a red light-emitting diode for red subpixel 22R, a green light-emitting diode for green subpixel 22G, and a blue light-emitting diode for blue subpixel 22B) and associated pixel circuitry formed from thin-film transistors 52. Each pixel may have an aspect ratio (ratio of width W to height H) that is close to 1 (e.g., within 10%, within 40%, within 15%, or other suitable amount). Use of pixels with aspect ratios close to 1 may help enhance display resolution.

As shown in FIG. 3, the subpixels of each pixel 22 can be oriented with their longitudinal axes (longer dimensions) parallel to horizontal dimension X (e.g., so that each subpixel is elongated along horizontal dimension X). This allows each pixel 22 (e.g., each set of three subpixels of different colors) to maintain a near-unitary aspect ratio while allowing the gate lines G of each column to access all of the subpixels of each pixel (e.g., allowing the gate lines G of each column of pixels to be coupled to all of the subpixels of that column). In the example of FIG. 3, there are three data lines DH per row of pixels 22 (e.g., a single data line DH is associated with each row of subpixels of a different color) and there are four gate lines G per column of pixels (e.g., two emission enable control lines and two scan lines). The gate lines G overlap each of the subpixels in pixel 22 and can therefore be used in controlling the operation of each of the subpixels (e.g., by controlling data loading from the respective data line DH that is associated with that subpixel, by controlling the emission of light from each subpixel during light emission periods, etc.).

Figure 4:
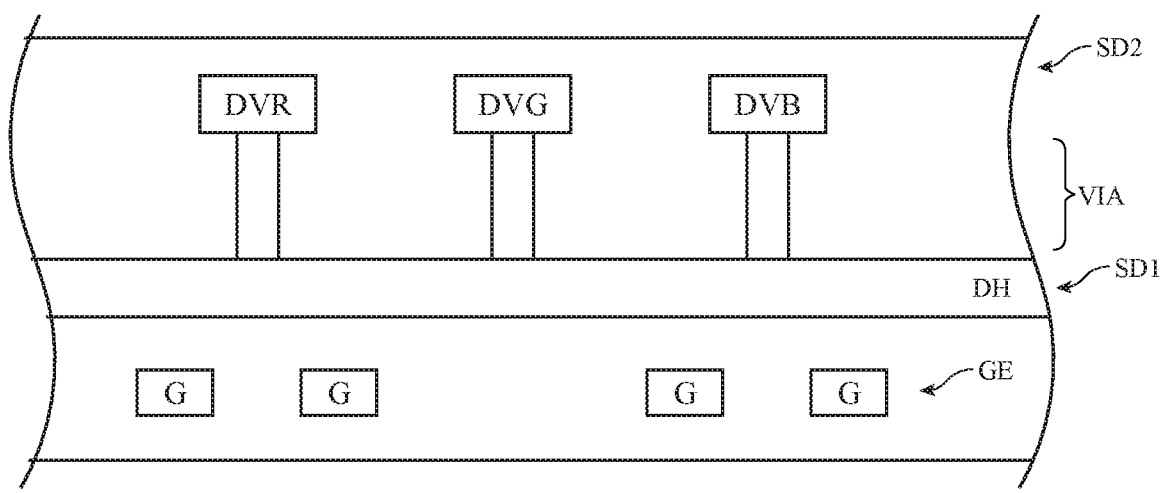
FIG. 4 is a cross-sectional side view of an illustrative display with signal routing lines in accordance with an embodiment.

FIG. 4 is a cross-sectional side view of illustrative metal layers that may be used in forming display 14. The cross-sectional side view of FIG. 4 is taken along the X axis of FIG. 3 and viewed along the Y axis of FIG. 3. As shown in FIG. 4, signal lines in display 14 may be formed from different layers of metal. For example, a first layer of metal may be used in forming vertical gate lines G (e.g., a gate metal layer GE, which is also used in forming gates for thin-film transistors 52). Horizontal data line portions DH may be formed from a second metal layer (sometimes referred to as a first source-drain metal layer SD1). Vertical data line portions DV (e.g., vertical portion DVR for conveying data to a horizontal data line portion for a row of red subpixels, a vertical portion DVG for conveying data to a horizontal data line portion for a row of green subpixel, and vertical portion DVB for conveying data to a horizontal data line portion for a row of blue subpixels) may be formed from a third layer of metal (sometimes referred to as a second source-drain metal layer SD2). Vias 40 may be formed from via metal that extends between layers SD2 and SD1.

Figure 5:
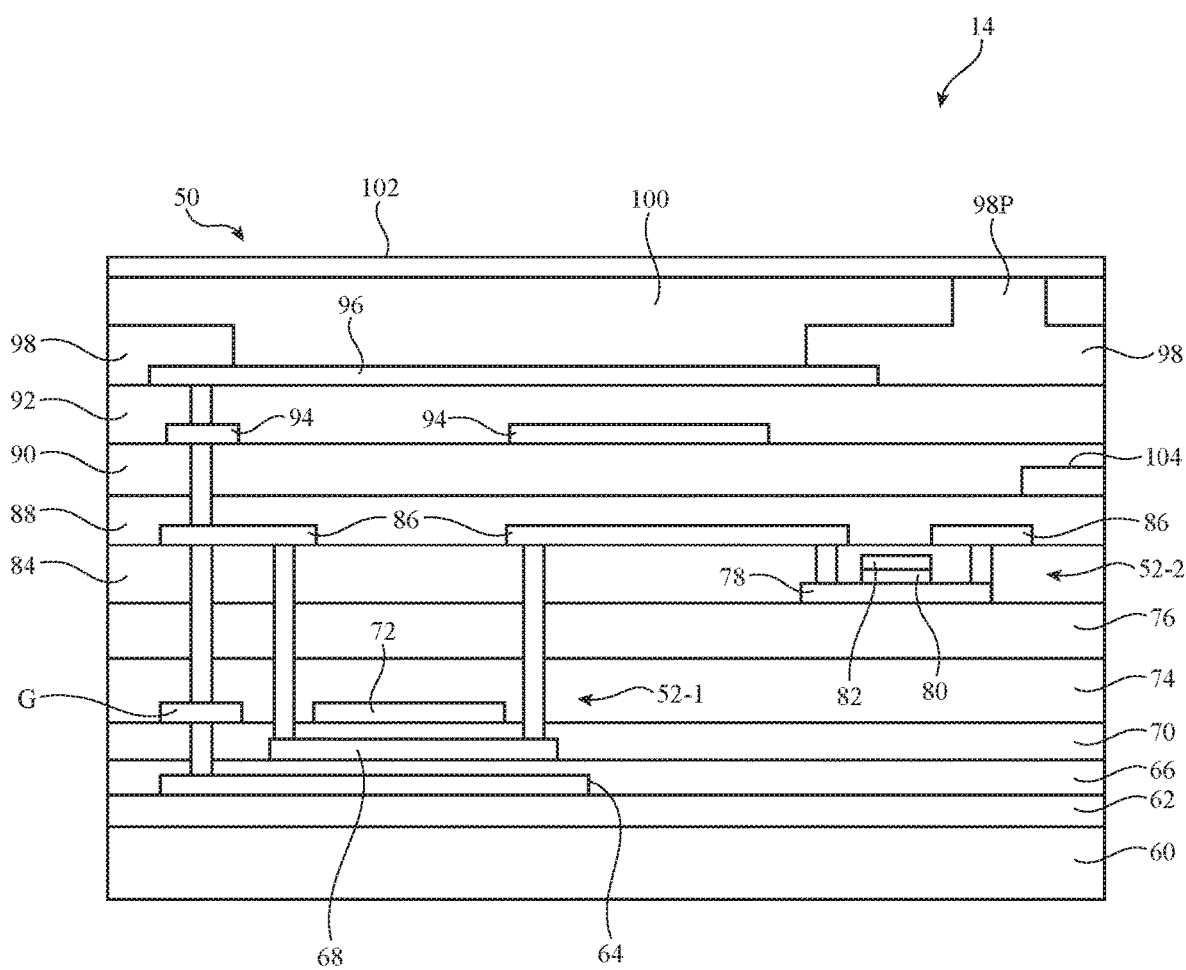
FIG. 5 is a cross-sectional side view of an illustrative organic light-emitting diode display in accordance with an embodiment.

FIG. 5 is a cross-sectional side view of an illustrative diode 50 and thin-film transistor 52 formed from these metal layers. Layer 60 may be a polyimide substrate layer. Layer 62 may be a dielectric buffer layer. Back-side metal layer 64 may be formed between buffer layer 62 and buffer layer 66. Semiconductor layer 68 may be a thin-film silicon layer (e.g., a polysilicon layer) on buffer layer 66. Gate insulator layer 70 may be formed from a dielectric such as silicon oxide or other dielectric and may be interposed between semiconductor layer 68 (e.g., the active layer of transistor 52-1) and gate 72. Gate 72 and gate lines such as gate line G may be formed from gate metal layer GE (FIG. 4). Interlayer dielectric layer 74 may cover gate 72 and gate lines G. Oxide buffer layer 76 may be formed on dielectric layer 74. Semiconductor layer 78 may be formed on layer 76. Layer 78 may be formed from a semiconducting oxide such as indium gallium zinc oxide or other semiconductor and may be a thin-film layer that serves as the active semiconductor layer in thin-film transistor 52-2. Gate insulator layer 80 may be formed on layer 78 and gate 82 for transistor 52-2 may be formed on layer 80. Interlayer dielectric layer 84 (e.g., oxide) may cover layer 82. Source drain metal 86 may be formed from layer SD1 (FIG. 4) and may be formed on layer 84. Metal 86 may form source-drain terminals for transistors 52-1 and 52-2. Dielectric layers 88, 90, and 92 may cover layer 86. Vertical data routing lines may be formed from source-drain metal layer SD2 (see, e.g., illustrative vertical data routing line 104 on layer 88). Metal 94 on layer 90 may be used in coupling anode 96 of organic light-emitting diode 50 to transistor 52-1. Pixel definition layer 98 may be formed on layer 92 and may have an opening that overlaps anode 96. Pixel definition layer 98 may have a spacer portion 98S to support overlapping display layers. Diode 50 may be formed from anode 96, cathode 102 (e.g., a transparent conductive layer) and an interposed layer of organic emissive material 100.

Figure 6:
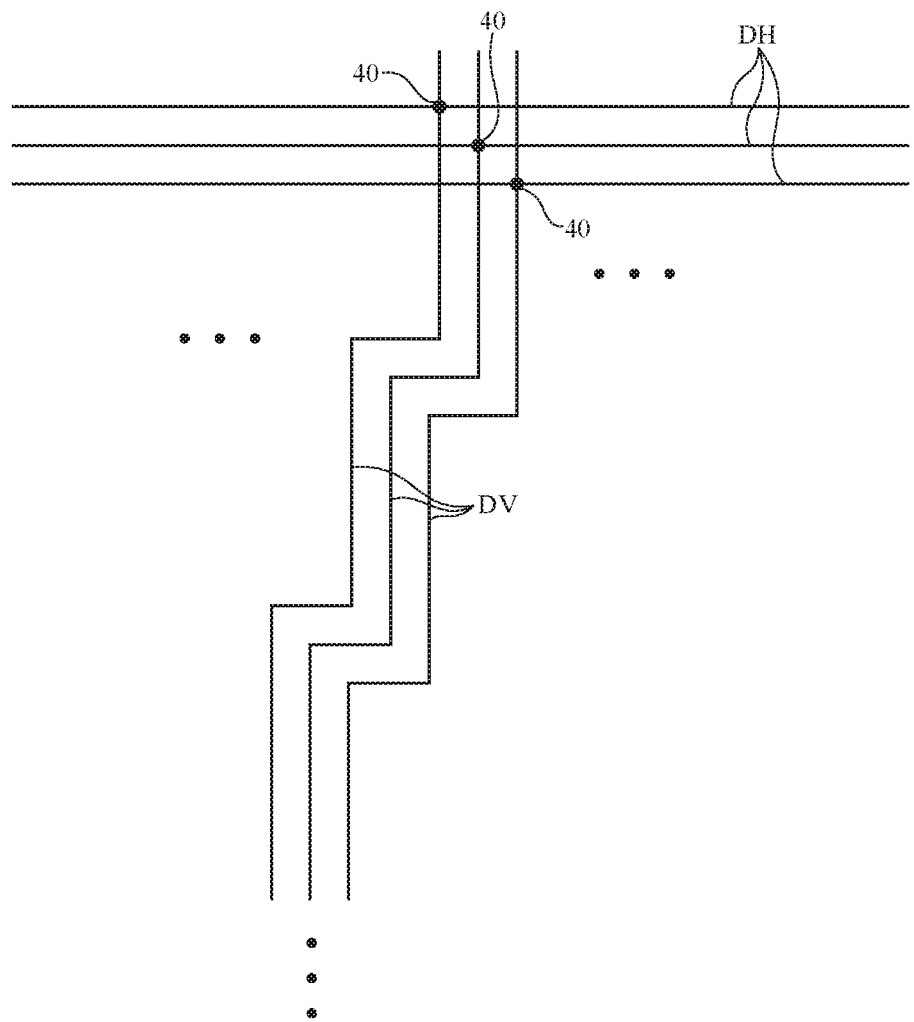
FIG. 6 is a top view of illustrative data lines in accordance with an embodiment.

If desired, non-horizontal data line portions such as vertical portions DV of data lines D may contain zigzag portions to reduce overlap and capacitive coupling with nearby gate lines G. An arrangements of this type is shown in FIG. 6. In general, any suitable zigzag patterns may be used. The example of FIG. 6 is illustrative.

The foregoing is merely illustrative and modifications can be made to the described embodiments. The foregoing embodiments may be implemented individually or in any combination.

What is claimed is:

1. A display, comprising:
   display driver circuitry;
   a plurality of pixels organized in rows and columns;
   a plurality of gate lines extending along a first direction, each of which is associated with a respective one of the columns of pixels, wherein the plurality of gate lines are formed from a first metal layer, and a dielectric layer is formed over the first metal layer; and
   a plurality of data lines, each of which has a first portion that is associated with a respective one of the rows of pixels and extends along a second direction which is orthogonal to the first direction, and each of which has a second portion that extends from the display driver circuitry towards a respective one of the first portions, wherein the second portions are formed from a second metal layer that is formed over the dielectric layer, wherein the first portions are formed from a third metal layer that is separated from the second metal layer by an additional dielectric layer, and wherein a given second portion of the second portions is coupled to a given pixel of the plurality of pixels via a corresponding first portion of the first portions, a given gate line of the plurality of gate lines is coupled to the given pixel, and the given second portion is formed over the given gate line with an offset.

2. The display defined in claim 1 further comprising:
   vias, wherein each via couples one of the second portions to a respective one of the first portions.

3. The display defined in claim 2 further comprising:
   a substrate having one or more edges, wherein the display driver circuitry is disposed along a given one of the edges, and wherein the display driver circuitry supplies image data signals to the data lines and gate line signals to the gate lines.

4. The display defined in claim 1, wherein the pixels comprise subpixels that are arranged along the first direction.

5. The display defined in claim 1, wherein each of the pixels comprise red, green, and blue subpixels and wherein each gate line in a given column of the pixels spans the red, green, and blue subpixels of each of the pixels in that column of pixels.

6. The display defined in claim 1, wherein each pixel includes first, second, and third subpixels, wherein the first, second, and third subpixels are arranged along the first direction, and wherein at least two of the gate lines in each column of the pixels are configured to control the red, green, and blue subpixels of each of the pixels in that column of pixels.

7. The display defined in claim 6, wherein the first portions are formed from a third metal layer, and wherein the first, second, and third subpixels of each pixel include respective first, second, and third light-emitting diodes.

8. The display defined in claim 1 further comprising:
   vias, wherein each via couples one of the second portions to a respective one of the first portions and wherein the pixels comprise organic light-emitting diode pixels.

9. The display defined in claim 1 further comprising:
   vias, wherein each via couples one of the second portions to a respective one of the first portions and wherein the pixels comprise liquid crystal display pixels.

10. The display defined in claim 1, wherein at least two of the gate lines are arranged in each of the columns of pixels.

11. The display defined in claim 1, wherein the pixels include thin-film transistors with transistor gates and wherein the transistor gates are formed from portions of the first metal layer.

12. A display, comprising:
    pixels organized in rows and columns, a given pixel of the pixels having a first subpixel of a first color and a second subpixel of a second color;
    gate lines, wherein each of the gate lines is configured to control a respective one of the columns of pixels, wherein at least two gate lines of the gate lines are both coupled to the first subpixel and at least the two gate lines are both coupled to the second subpixel, and wherein at least the two gate lines overlap each of the first and second subpixels and are configured to control each of the first and second subpixels; and
    data lines configured to load data into the rows of pixels, wherein each data line has a first data line portion extending along with a respective one of the rows of pixels and has a second data line portion extending orthogonally to the first data line portion.

13. The display defined in claim 12 further comprising vias, wherein each via couples a respective one of the first data line portions to a respective one of the second data line portions.

14. The display defined in claim 12 further comprising display driver circuitry, wherein the display driver circuitry is coupled to the gate lines and the first data line portions.

15. The display defined in claim 14, wherein the display driver circuitry is configured to provide data to the pixels over the data lines while controlling the pixels using the gate lines and wherein each pixel in each column of pixels is coupled to at least two corresponding gate lines of the gate lines.

16. The display defined in claim 14, wherein each pixel in each column of pixels is coupled to a respective set of at least two corresponding gate lines of the gate lines.

17. A display, comprising:
   organic light-emitting diode pixels organized in row and columns, each pixel including a respective organic light-emitting diode;
   display driver circuitry;
   gate lines coupled to the display driver circuitry, wherein the gate lines extend along the columns of the organic light-emitting diode pixels; and
   data lines each of which has a first data line portion and a second data line portion that extends orthogonally to the first data line portion between the display driver circuitry and a respective one of the first data line portions, wherein each of the first data line portions is coupled to a respective row of the organic light-emitting diode pixels, wherein the display driver circuitry is configured to provide data to the organic light-emitting diode pixels over the data lines while controlling the organic light-emitting diode pixels using the gate lines, wherein the organic light-emitting diode pixels in each column of the columns of pixels are each coupled to at least three corresponding gate lines of the gate lines, and wherein a first gate line in the at least three corresponding gate lines is configured to access each pixel in a given column of the columns of pixels, a second gate line in the at least three corresponding gate lines is configured to access each pixel in the given column, and a third gate line in the at least three corresponding gate lines is configured to access each pixel in the given column.

18. The display defined in claim 17 further comprising vias, wherein each via couples a respective one of the first data line portions to a respective one of the second data line portions.

19. The display defined in claim 17, wherein the organic light-emitting diode pixels in each column of the columns of pixels are each coupled to at least four corresponding gate lines of the gate lines.

20. The display defined in claim 1, wherein each of the second portions extends along the first direction, and the third metal layer is formed between the first metal layer and the second metal layer.

21. The display defined in claim 12, wherein a third gate line of the gate lines is coupled to the first subpixel and coupled to the second subpixel, and wherein the third gate line overlaps each of the first and second subpixels and is configured to control each of the first and second subpixels.

* * * * *